United States Patent
Gupta et al.

(10) Patent No.: US 11,081,153 B2
(45) Date of Patent: Aug. 3, 2021

(54) MAGNETIC MEMORY DEVICE WITH BALANCING SYNTHETIC ANTI-FERROMAGNETIC LAYER

(71) Applicant: Taiwan Semiconductor Manufacturing Co., Ltd., Hsin-Chu (TW)

(72) Inventors: Gaurav Gupta, Hsinchu (TW); Zhiqiang Wu, Chubei (TW); William J. Gallagher, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/395,571

(22) Filed: Apr. 26, 2019

(65) Prior Publication Data

US 2020/0005845 A1    Jan. 2, 2020

Related U.S. Application Data

(60) Provisional application No. 62/692,313, filed on Jun. 29, 2018.

(51) Int. Cl.
*G11C 11/16* (2006.01)
*H01L 43/12* (2006.01)
(Continued)

(52) U.S. Cl.
CPC .......... *G11C 11/161* (2013.01); *H01L 27/228* (2013.01); *H01L 43/08* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 6,950,335 B2 | 9/2005 | Dieny et al. | |
| 2003/0030945 A1* | 2/2003 | Heinonen | B82Y 10/00 360/324.2 |

(Continued)

OTHER PUBLICATIONS

H. Sato et al., "Properties of magnetic tunnel junctions with a MgO/CoFeB/Ta/CoFeB/MgO recording structure down to junction diameter of 11nm", Applied Physics Letters 105, 062403 (2014).

(Continued)

*Primary Examiner* — Long Pham
(74) *Attorney, Agent, or Firm* — Eschweiler & Potashnik, LLC

(57) ABSTRACT

In some embodiments, the present application provides a magnetic memory device. The magnetic memory device comprises a bottom electrode, and a first synthetic anti-ferromagnetic (SyAF) layer including a first pinning layer and a second pinning layer disposed over the bottom electrode and having opposite magnetization directions and separated by a first spacer layer. The magnetic memory device further comprises a reference layer disposed over the first pair of pinning layers and a free layer disposed over the reference layer and separated from the reference layer by a tunneling barrier layer. The magnetic memory device further comprises a second synthetic anti-ferromagnetic (SyAF) layer including a third pinning layer and a fourth pinning layer disposed over the free layer and having opposite magnetization directions and separated by a second spacer layer.

20 Claims, 8 Drawing Sheets

(51) Int. Cl.
*H01L 27/22* (2006.01)
*H01L 43/08* (2006.01)
*H01L 43/10* (2006.01)

(56) References Cited

U.S. PATENT DOCUMENTS

| | | | | |
|---|---|---|---|---|
| 2008/0272771 A1* | 11/2008 | Guo | ............... | G01R 33/098 324/260 |
| 2014/0212691 A1* | 7/2014 | Singleton | ............ | G01R 33/091 428/811.2 |
| 2020/0005845 A1* | 1/2020 | Gupta | ............... | G11C 11/161 |

OTHER PUBLICATIONS

Kay Yakushiji et al., "Ultralow-Voltage Spin-Transfer Switching in Perpendicularly Magnetized Magnetic Tunnel Junctions with Synthetic Antiferromagnetic Reference Layer", Applied Physics Express 6 (2013) 113006.

Kay Yakushiji et al., "Very strong antiferromagnetic interlayer exchange coupling with iridium spacer layer for perpendicular magnetic tunnel junctions", Applied Physics Letters 110, 092406 (2017).

Du-Yeong Lee et al., "Dependency of Tunneling-Magnetoresistance Ratio on Nanoscale Spacer Thickness and Material for Double MgO Based Perpendicular-Magnetic-Tunneling-Junction", Scientific Reports vol. 6, Article No. 38125 (2016).

J. Swerts et al., "Solving the BEOL compatibility challenge of top-pinned magnetic tunnel junction stacks," 2017 IEEE International Electron Devices Meeting (IEDM), San Francisco, CA, 2017, pp. 38.6.1-38.6.4.

J. Swerts et al., "Top pinned magnetic tunnel junction stacks with high annealing tolerance for high density STT-MRAM applications," 2017 IEEE International Magnetics Conference (INTERMAG), Dublin, 2017, pp. 1-1.

E. Liu et al., "Control of Interlayer Exchange Coupling and Its Impact on Spin—Torque Switching of Hybrid Free Layers With Perpendicular Magnetic Anisotropy," in IEEE Transactions on Magnetics, vol. 53, No. 11, pp. 1-5, Nov. 2017.

Kay Yakushiji et al., "Three-dimensional integration technology of magnetic tunnel junctions for magnetoresistive random access memory application", Applied Physics Express 10, 063002 (2017).

Kar et al. "Co/Ni Based p-MTJ Stack for Sub-20nm High Density Stand Alone and High Performance Embedded Memory Application." 2014 IEEE International Electron Devices Meeting, Dec. 15-17, 2014.

Ikeda et al. "Perpendicular-Anisotropy CoFeB—MgO Based Magnetic Tunnel Junctions Scaling Down to 1X nm." 2014 IEEE International Electron Devices Meeting, Dec. 15-17, 2014.

* cited by examiner

MAGNETIC MEMORY DEVICE WITH BALANCING SYNTHETIC ANTI-FERROMAGNETIC LAYER

REFERENCE TO RELATED APPLICATION

This Application claims the benefit of U.S. Provisional Application No. 62/692,313, filed on Jun. 29, 2018, the contents of which are hereby incorporated by reference in their entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic memory devices including tunnel junctions (MTJs) can be used in hard disk drives and/or RAM, and thus are promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
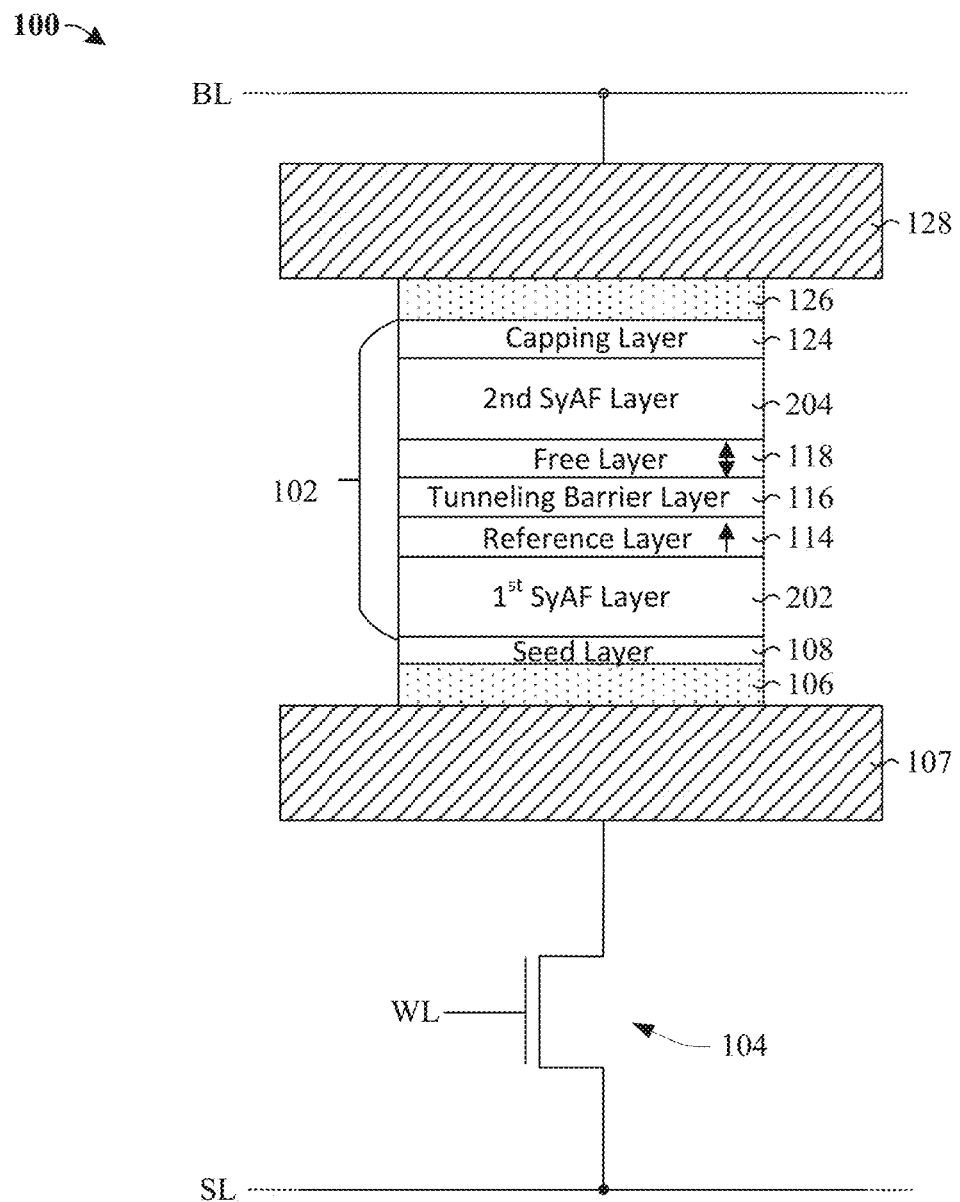
FIG. 1 illustrates a cross-sectional view of a magnetic memory device including a magnetic tunneling junction (MTJ) stack including a balancing synthetic anti-ferromagnetic (SyAF) layer according to some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel orientation, electrons will tunnel through the tunnel barrier layer at a higher rate, such that the MTJ is in a low-resistance state. Conversely, if the magnetization directions of the reference layer and free layer are in an anti-parallel orientation, electrons will tunnel through the tunnel barrier layer at a lower rate, such that the MTJ is in a high-resistance state. Depending upon an applied current's magnitude and direction, the MTJ can be switched between these two states of electrical resistance, one state with a low resistance (magnetization directions of reference layer and free layer are parallel) and a second state with a high resistance (magnetization directions of reference layer and free layer are anti-parallel), to store data.

In a MTJ, the free layer and the reference layer are magnetically coupled due to their dipolar fields (also called their stray field). The free layer exerts a dipolar field on the reference layer because of the stray field generated around the free layer. Vice-versa, the reference layer exerts a dipolar field on the free layer because of the stray field generated around the reference layer. The free layer and the reference layer magnets relax to point along their respective easy-axes, which are also called their magnetization directions. In this application, a perpendicular magnetization anisotropy direction is discussed as an example, but devices with other magnetic anisotropy directions, such as magnetic anisotropy directions within planes of corresponding magnetic layers, are also amenable. In the perpendicular magnetization case, the reference layer and the free layer have magnetization directions that are perpendicular to the planes of the free layer and reference layer. Consider a case in the context of an x-y-z coordinate system where the reference layer, tunnel barrier layer, and free layer each extend laterally in the x and y directions (x-y plane); and the reference layer, tunnel barrier layer, and free layer are stacked over one another along the z axis. In such an example, the magnetization directions for the free layer and reference layer would point along the z-axis within the respective layers. The magnetizations directions are parallel (e.g., both upwards or both downwards along the z-axis, called the P-state hereafter) or anti-parallel (e.g., one upwards and the other downwards along the z-axis, called the AP-state hereafter) depending on the state stored, and thus give rise to a low resistance or high resistance state for the MTJ.

As discussed above, for the P-state, the magnetization direction of the free layer is set to be parallel to the magnetization direction of the reference layer. Due to the dipolar field from the reference layer, the P-state is strongly stabilized, and it is difficult to switch from P-state to AP-state, where the magnetization direction of the free layer is set to be anti-parallel to the magnetization direction of the reference layer. More time and current are needed to effectuate the switching. On the other hand, the AP-state is destabilized by the dipolar field from the reference layer, and the retention of the information is difficult. To solve this unbalanced switching problem, one or multiple pinning layers are added at the other side of the reference layer to balance the net stray field on the free layer. The net stray field on the free layer is minimized such that the destabilizing of either P-state or the AP-state is minimized. However, the stray fields of the pinning layers couple not only the free layer, but also to the reference layer. The net stray field on the reference layer after adding the pinning layers can be negative. Thus, the magnetization direction of the reference layer has a tendency to become reversed, resulting in what is effectively a back-switching of the MTJ state. (The back switching is also aided by suitably directed spin injection into the reference layer from currents flowing during the write process.) The back-switching tendency is stronger for larger write current through the MTJ. In addition, the stray fields applied on the pinning layers may also introduce instability to the pinning layers. The magnetization vectors of the reference layer and the pinning layers may not reliably remain as initialized. In that case, the state of the MTJ is unknown, and the circuit cannot reliably control the MTJ. The problems described above become more significant as technologies advance and there is a need for ultra-fast switching (e.g., on the scale of 10 ns or less for embedded MRAMs). The current requirement for switching scales-up rapidly with the smaller write-time. These large currents and voltages cause more severe uncertainty or back-switching issues due to the negative stray field applied on the reference layer.

Thus, the present disclosure provides for an improved ferromagnetic memory cell that makes use of balancing synthetic anti-ferromagnetic (SyAF) layer. According to some embodiments, multiple pairs of pinning layers are arranged on two sides of the MTJ to balance the stray fields within the stack so as simultaneously enable zero to weak stray field on the free layer while achieving the stabilization of the reference layer. One pair of pinning layers is arranged under the reference layer. A balancing synthetic anti-ferromagnetic (SyAF) layer, including an additional pair of pinning layers is added on the other side of the reference layer, i.e. on the free layer side. A spacer layer is disposed between the additional pair of pinning layers for interexchange coupling (IEC) coupling. This IEC coupling promotes the additional pair of pinning layers to mutually stabilize each other. By having the balancing SyAF layer on the other side of the reference layer, zero to weak stray field on the free layer and positive stray field on the reference layer can be simultaneously achieved, such that balance of P-state and the AP-state and the stability of the magnetization direction of the reference layer due to influences from the pinned layers can be achieved and improved.

Referring to FIG. 1, a cross-sectional view of a magnetic memory device 100 in accordance with some embodiments is provided. The magnetic memory device 100 includes a magnetic tunnel junction (MTJ) stack 102 and an access transistor 104. The access transistor is coupled to the MTJ stack 102 by a first metal wire 107 disposed under a bottom electrode 106. A bit line (BL) is coupled to one end of the MTJ stack 102 through a top electrode 126 disposed under a second metal wire 128, and a source line (SL) is coupled to an opposite end of the MTJ stack 102 through the access transistor 104. Thus, application of a suitable word line (WL) voltage to a gate electrode of the access transistor 104 couples the MTJ stack 102 between the BL and the SL. Consequently, by providing suitable bias conditions, the MTJ stack 102 can be switched between two states of electrical resistance, one state with a low resistance (magnetization directions of a reference layer 114 and a free layer 118 are parallel) and the other state with a high resistance (magnetization directions of reference layer 114 and free layer 118 are anti-parallel), to store data.

The MTJ stack 102 is disposed between the bottom electrode 106 and the top electrode 126. In some embodiments, the bottom electrode 106 and the top electrode 126 may comprise tantalum (Ta), tantalum nitride (TaN), or ruthenium (Ru), for example. In some embodiments, the MTJ stack 102 comprises the reference layer 114 disposed over the bottom electrode 106 and a free layer 118 disposed over the reference layer 114 and separated from the reference layer 114 by a tunneling barrier layer 116. The reference layer 114 is a ferromagnetic layer that has a magnetization direction that is "fixed". As an example, the magnetization direction of the reference layer 114 can be "up", i.e., perpendicular to the plane of the reference layer pointing to the top electrode 126, as shown in FIG. 1 by the arrow. The tunnelling barrier layer 116, which can manifest itself as a thin dielectric layer or non-magnetic metal layer in some cases, separates the reference layer 114 from the free layer 118. The tunnelling barrier layer 116 can be a tunnel barrier which is thin enough to allow quantum mechanical tunnelling of current between the reference layer 114 and the free layer 118. In some embodiments, the tunneling barrier layer 116 can comprise an amorphous barrier, such as aluminum oxide ($AlO_x$) or titanium oxide ($TiO_x$), or a crystalline barrier, such as manganese oxide (MgO) or a spinel (e.g., $MgAl_2O_4$). The free layer 118 is capable of changing its magnetization direction between one of two magnetization states, which correspond to binary data states stored in the memory cell. For example, in a first state, the free layer 118 can have an "up" magnetization direction in which the magnetization of the free layer 118 is aligned in parallel with the magnetization direction of the reference layer 114, thereby providing the MTJ stack 102 with a relatively low resistance. In a second state, the free layer 118 can have a "down" magnetization direction which is aligned anti-parallel with the magnetization direction of the reference layer 114, thereby providing the MTJ stack 102 with a relatively high resistance. In some embodiments, the free layer 118 may comprise magnetic metal, such as iron, nickel, cobalt, boron and alloys or mixtures thereof, for example, such as a CoFeB ferromagnetic free layer.

A first synthetic anti-ferromagnetic (SyAF) layer 202 is disposed under the reference layer 114, i.e., at the side of the reference layer opposite to the free layer 118. The first SyAF layer 202 is made of ferromagnetic materials arranged to have constrained or "fixed" magnetization directions. This "fixed" magnetization direction can be achieved in some cases by an initializing exposure to a high magnetic field after the entire chip is manufactured. As an example, the first SyAF layer 202 may comprise a first pair of pinning layers including a first pinning layer and a second pinning layer. The first pinning layer and the second pinning layer may have opposite magnetization directions, with the first pinning layer having its magnetization direction aligned with the magnetization direction of the reference layer. Using the same example given above, the first pinning layer has the same "up" magnetization direction with the reference layer. The second pinning layer has a magnetization direction aligned and anti-paralleled with the magnetization direction of the reference layer. Using the same example given above, the second pinning layer has an opposite "down" magnetization direction with the reference layer.

A second SyAF layer 204 is disposed over the free layer 118, i.e., at the other side of the free layer 118 opposite to the reference layer 114. In some embodiments, the second SyAF layer 204 may comprise a second pair of pinning layers including a third pinning layer and a fourth pinning layer. Similar to what w described above, the third pinning layer and the fourth pining layer may also be made of ferromagnetic material having a magnetization direction that is constrained or "fixed". The third pinning layer and the fourth pinning layer have opposite magnetization directions. One of the third pinning layer and the fourth pinning layer has a magnetization direction aligned parallel with the magnetization direction of the reference layer 114 while the other of the third pinning layer and the fourth pinning layer has a magnetization direction aligned anti-parallel with the magnetization direction of the reference layer 114. Using the same example given above, the third pinning layer may have the "down" magnetization direction. The fourth pinning layer may have the "up" magnetization direction. In an alternative implementation, the MTJ stack 102 can be vertically "flipped", such that the first SyAF layer 202 and the reference layer 114 are disposed over the free layer 118 and the second SyAF layer 204 in the stated order flipped from top to bottom.

A net stray field is exerted on the free layer 118 by the magnetizations of the reference layer 114, the first SyAF layer 202, and the second SyAF layer 204. The reference layer 114, the first SyAF layer 202, and the second SyAF layer 204 are well designed such that the net stray field exerted on the free layer 118 is zero or negligible. Thereby, the P-state and the AP-state of magnetic memory device 100 are balanced and both stabilized. A net stray field is also exerted on the reference layer 114 by the magnetizations of the free layer 118, the first SyAF layer 202, and the second SyAF layer 204. The free layer 118, the first SyAF layer 202, and the second SyAF layer 204 are well designed such that the net stray field exerted on the reference layer 114 is zero or in the same direction of the intrinsic magnetization direction of the reference layer 114. For example, the net stray field exerted on the reference layer 114 is zero or close to zero when the stray field of the free layer 118 is "down" (in the opposite direction of the intrinsic magnetization direction of the reference layer 114) and is in the same direction of the intrinsic magnetization direction of the reference layer 114 when the stray field of the free layer 118 is "up" (in the same direction of the intrinsic magnetization direction of the reference layer 114.) Thereby, the back switching issue can be eliminated or at least reduced. As an alternative approach, the SyAF layers 202 and 204 can also be designed without counting the free layer influence on the reference layer 114 and the net stray field exerted on the reference layer 114 by the first SyAF layer 202 and the second SyAF layer 204 is zero, close to zero, or in the same direction of the intrinsic magnetization direction of the reference layer 114.

A seed layer 108 may be disposed between the bottom electrode 106 and the first SyAF layer 202. In some embodiments, the seed layer 108 comprises materials such as nickel chromium (NiCr), cobalt iron boron (CoFeB), magnesium (Mg), and/or tantalum (Ta). A capping layer 124 may be disposed between the second SyAF layer 204 and the top electrode 126. The capping layer 124 often enhances anisotropy for the MTJ stack.

Figure 2:
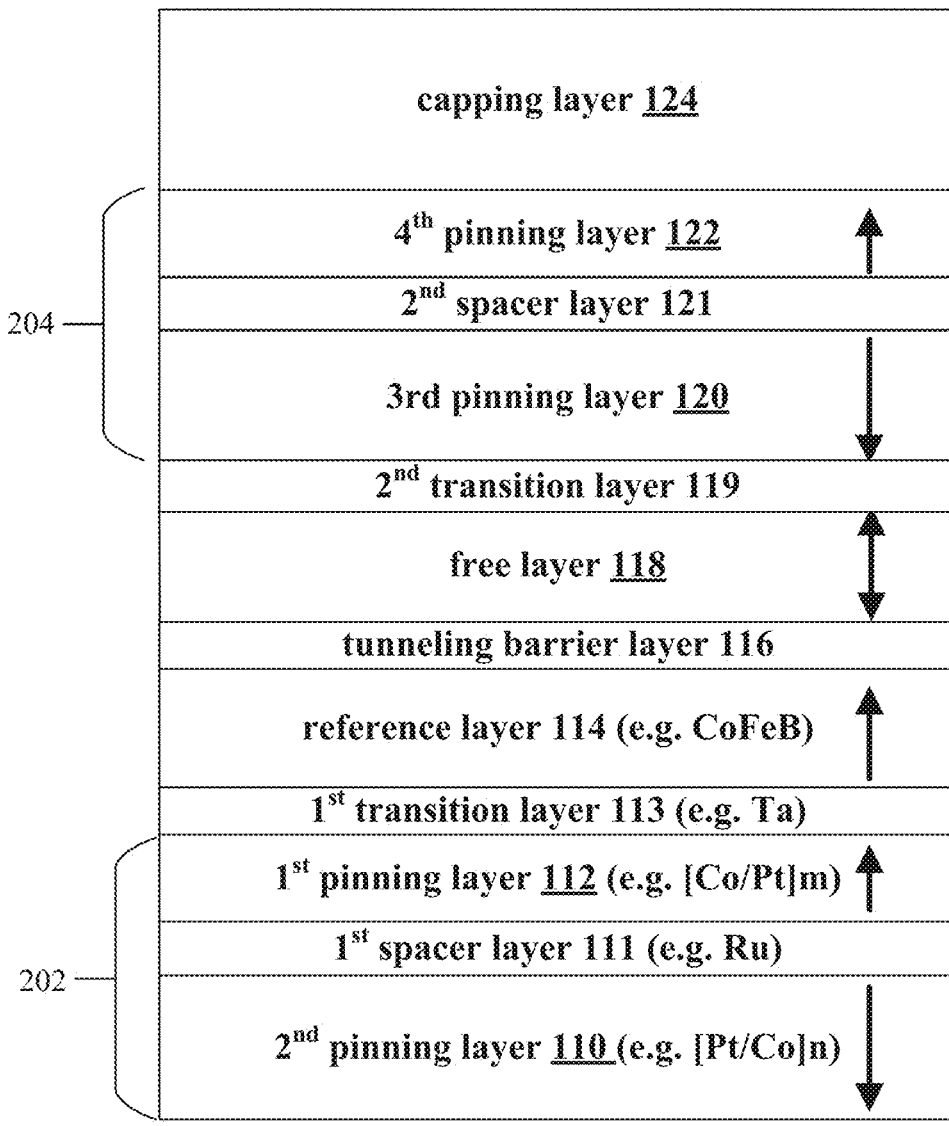
FIG. 2 illustrates a more detailed cross-sectional view of the MTJ stack of FIG. 1 according to some embodiments.

FIG. 2 illustrates a more detailed cross-sectional view of the MTJ stack 102 of FIG. 1 according to some embodiments. Some non-ferromagnetic layers between the ferromagnetic layers were not shown in FIG. 1 for simplicity reason; and these non-ferromagnetic layers are shown in FIG. 2 and described herein. It will be appreciated that materials of the ferromagnetic layers and the non-ferromagnetic layers described hereafter are merely examples for non-limiting illustration purpose, and other suitable number of layers in suitable order with allowable materials are amenable of this application. As stated in FIG. 1, the free layer 118 is separated from the reference layer 114 by the tunnelling barrier layer 116. The free layer 118 and the reference layers are ferromagnetic layers. In some embodiments, the free layer 118 and the reference layer may comprise iron, cobalt, nickel, iron cobalt, nickel cobalt, cobalt iron boride, iron boride, iron platinum, iron palladium, or the like. As an example, the free layer 118 and the reference layer 114 may respectively be comprised of a cobalt iron boron (CoFeB) layer. The tunneling barrier layer 116 prevents electrical shorting between the free layer 118 and the reference layer 114, while still allowing electrons to tunnel through the tunneling barrier layer 116 under proper conditions. The tunneling barrier layer 116 may comprise, for example, magnesium oxide (MgO), aluminum oxide (e.g., $Al_2O_3$), nickel oxide, gadolinium oxide, tantalum oxide, molybdenum oxide, titanium oxide, tungsten oxide, or the like. The reference layer 114 can have a fixed or "pinned" magnetic orientation, while the free layer 118 has a variable or "free" magnetic orientation, which can be switched between two or more distinct magnetic polarities that each represents a different data state, such as a different binary state.

On one side of the reference layer 114 opposite to the free layer 118, a first spacer layer 111 is disposed between the first pinning layer 112 and the second pinning layer 110. The first spacer layer 111 can be an anti-parallel coupling (APC) layer that causes an interexchange coupling (IEC) between the first pinning layer 112 and the second pinning layer 110 such that the first pining layer 112 and the second pinning layer 110 have anti-parallel magnetic directions. As an example, the first spacer layer 111 may comprise ruthenium (Ru) or Iridium (Ir). The first pinning layer 112, the second pinning layer 110, and the spacer layer 111 constitute a first synthetic anti-ferromagnetic (SyAF) layer 202 where the first pinning layer 112 and the second pinning layer 110 stabilize each other, which can be due to IEC from the first space layer 111. In some embodiments, the first pinning layer 112 has a magnetization direction aligned in parallel with the magnetization direction of the reference layer 114.

Using the same example given above, the first pinning layer 112 has the same "up" magnetization direction (shown by the arrow) with the reference layer 114. The second pinning layer 110 has a magnetization direction aligned anti-parallel with the magnetization direction of the reference layer 114. Using the same example given above, the second pinning layer 110 has an opposite "down" magnetization direction (shown by the arrow) with the reference layer 114. As an example, the first pinning layer 112 may comprise cobalt layers and nickel layers one stacked above another $(Co/Ni)_m$. The first pinning layer 112 may also be a cobalt palladium stack $(Co/Pd)_m$, or a cobalt platinum stack $(Co/Pt)_m$, where m can be a positive integer. The second pining layer 110 may comprise a reverse of the compositions of the first pining layer 112 with the same or a different number of layers. For example, the second pining layer 110 may comprise nickel layers and cobalt layers one stacked above another $(Ni/Co)_n$, or palladium cobalt stack $((Pd/Co)_n$, or platinum cobalt stack $(Pt/Co)_n$, where n can be a positive integer.

On the other side of the reference layer 114 next to the free layer 118, a second spacer layer 121 is disposed between a third pinning layer 120 and a fourth pinning layer 122. The second spacer layer 121 can be an anti-parallel coupling (APC) layer that causes an interexchange coupling (IEC) between the third pinning layer 120 and the fourth pinning layer 122 such that the third pinning layer 120 and the fourth pinning layer 122 have anti-parallel magnetic directions. The third pinning layer 120, fourth pinning layer 122, and spacer layer 121 constitute a second SyAF layer 204 where third pinning layer 120 and the fourth pinning layer 122 stabilize each other, which can be due to IEC coupling via the spacer layer 121. The third pinning layer 120 and the fourth pinning layer 122 have opposite magnetization directions. In some embodiments, the third pinning layer 120 has a magnetization direction aligned anti-parallel with the magnetization direction of the reference layer 114 while the fourth pinning layer 122 has a magnetization direction aligned parallel with the magnetization direction of the reference layer 114. Using the same example given above, the third pinning layer 120 may have the "down" magnetization direction (shown by the arrow). The fourth pinning layer 122 may have the "up" magnetization direction (shown by the arrow). The third pinning layer 120 may comprise a reverse of the compositions of the fourth pining layer 122. The third pinning layer 120 may have a thickness greater than that of the fourth pinning layer 122. As an example, the third pinning layer 120 may comprise nickel layers and cobalt layers one stacked above another $(Ni/Co)_q$, or palladium cobalt stack $((Pd/Co)_q$, or platinum cobalt stack $(Pt/Co)_q$, where q can be a positive integer. The fourth pining layer 122 may comprise $(Co/Ni)_s$, $(Co/Pd)_s$, or cobalt platinum stack $(Co/Pt)_s$, where s can be a positive integer, and q can be greater than s.

A first transition layer 113 may be disposed between the first pinning layer 112 and the reference layer 114. A second transition layer 119 may be disposed on the other side of the free layer 118 opposite to the reference layer 114 between the free layer 118 and the third pinning layer 120. As an example, the first spacer layer 111 and the second spacer layer 121 may respectively comprise ruthenium (Ru) or Iridium (Ir). The first transition layer 113 may be disposed directly on first pinning layer 112. The second transition layer 119 may be disposed directly on the free layer 118, thereby separating the third pinning layer 120 from the free layer 118. The first transition layer 113 and the second transition layer 119 are non-magnetic materials that are configured as a buffer layer, a lattice match layer, and/or a diffusion barrier. In some embodiments, the first transition layer 113 and the second transition layer 119 may respectively comprise tantalum (Ta), tungsten (W), molybdenum (Mo), Hafnium (Hf), or CoFeW.

The capping layer 124 is disposed over the fourth pinning layer 122. The capping layer 124 enhances anisotropy and prevents diffusion of a diffusive species to other layers of the MTJ stack 102. As examples, the capping layer 124 may comprise magnesium oxide (MgO) or tungsten (W).

Figure 3:
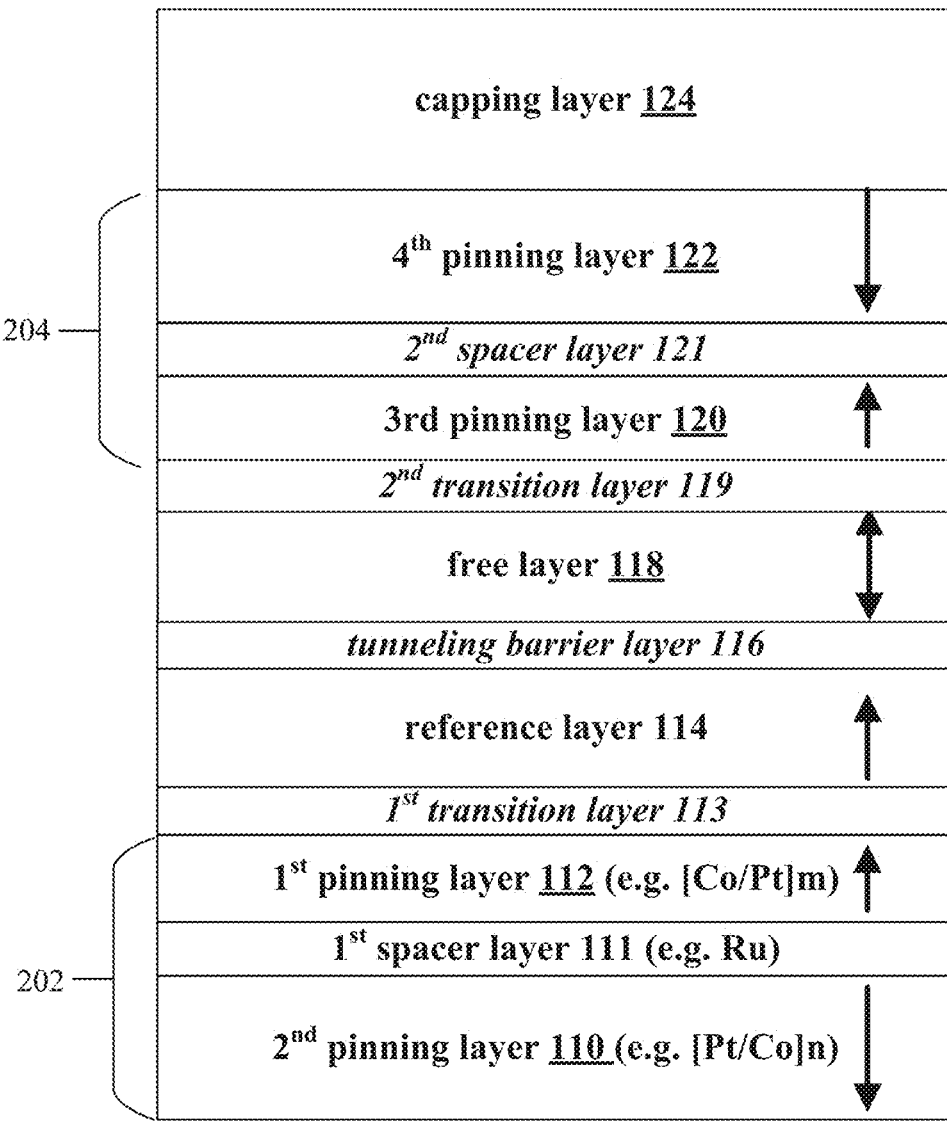
FIG. 3 illustrates a cross-sectional view of an MTJ stack including a balancing SyAF layer according to some alternative embodiments.

FIG. 3 illustrates a cross-sectional view of an MTJ stack 102 including a balancing SyAF layer 204 according to some alternative embodiments. The MTJ stack 102 may be a more detailed structure of the MTJ stack 102 of FIG. 1, or can also stand alone. Besides same or similar features shown and described with reference to FIG. 2 above, as alternative embodiments, the second SyAF layer 204 shown in FIG. 3 comprises a third pinning layer 120 and a fourth pinning layer 122 with opposite magnetic directions. In some embodiments, the third pinning layer 120 has a magnetization direction aligned parallel with the magnetization direction of the reference layer 114 while the fourth pinning layer 122 has a magnetization direction aligned anti-parallel with the magnetization direction of the reference layer 114. Using the same example given above, the third pinning layer 120 may have the "up" magnetization direction (shown by the arrow). The fourth pinning layer 122 may have the "down" magnetization direction (shown by the arrow). The third pinning layer 120 may comprise a reverse of the compositions of the fourth pining layer 122. The third pinning layer 120 may have a thickness smaller than that of the fourth pinning layer 122. As an example, the third pinning layer 120 may comprise $(Co/Ni)_q$, $(Co/Pd)_q$, or $(Co/Pt)_q$, where q can be a positive integer. The fourth pining layer 122 may comprise $(Ni/Co)_s$, $((Pd/Co)_s$, or $(Pt/Co)_s$, where s can be a positive integer, and q can be smaller than s.

Figure 4A:
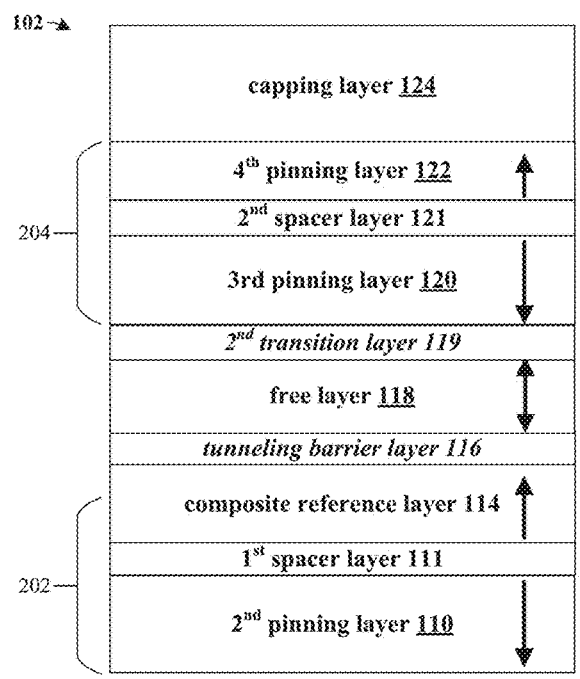
FIG. 4A illustrates a cross-sectional view of an MTJ stack including a balancing SyAF layer according to some alternative embodiments.
Figure 4B:
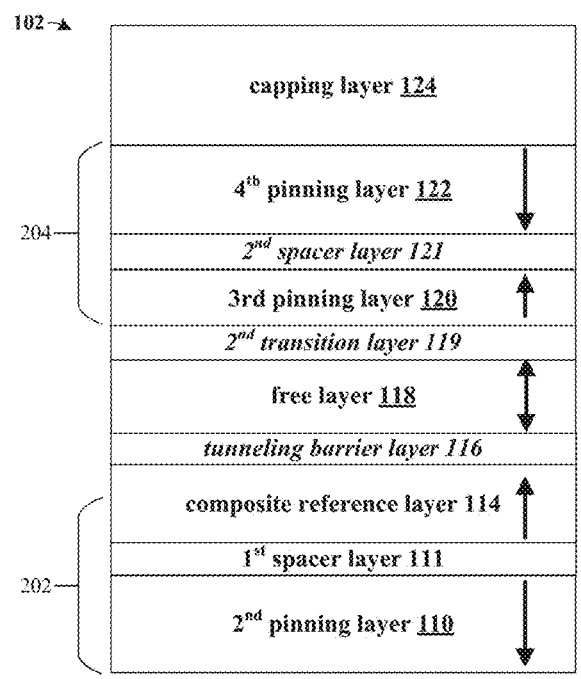
FIG. 4B illustrates a cross-sectional view of an MTJ stack including a balancing SyAF layer according to some alternative embodiments.

FIG. 4A and FIG. 4B respectively illustrate a cross-sectional view of an MTJ stack 102 including a balancing SyAF layer 204 according to some alternative embodiments. The MTJ stack 102 may be a more detailed structure of the MTJ stack 102 of FIG. 1, or can also stand alone. Besides same or similar features shown and described with reference to FIG. 2 or FIG. 3 above, as alternative embodiments, the first SyAF layer 202 shown in FIG. 4A and FIG. 4B comprises a composite reference layer 114 and a second pinning layer 110 with opposite magnetic directions. The composite reference layer 114 may be multi-layered including layers of Co or FeB for example and it may be graded, and may even include doping or a thin insertion layer from transition metals like W, Ta, Mo, Hf, V, etc. In some embodiments, the second pinning layer 110 has a magnetization direction aligned anti-parallel with the magnetization direction of the composite reference layer 114. Using the same example given above, the composite reference layer 114 may have the "up" magnetization direction (shown by the arrow). The second pinning layer 110 may have the "down" magnetization direction (shown by the arrow). A net stray field exerted on the free layer 118 by the magnetizations of the first SyAF layer 202 and the second SyAF layer 204 is zero or negligible. Thereby, the P-state and the AP-state of a memory device are balanced and both stabilized. A net stray field exerted on the composite reference layer 114 by the magnetizations of the second SyAF layer 204, and the second pinning layer 110 is zero or in the same direction of the intrinsic magnetization direction of the reference layer 114. Thereby, a back switching issue can be eliminated or at least reduced. (The free layer 118 stray field may be up or down depending on the memory state of the MTJ 102, so designing the SyAF layers 202 and 204 without regard to the free layer influence on the reference layer 114 in this manner is a preferred approach.)

Figure 5A:
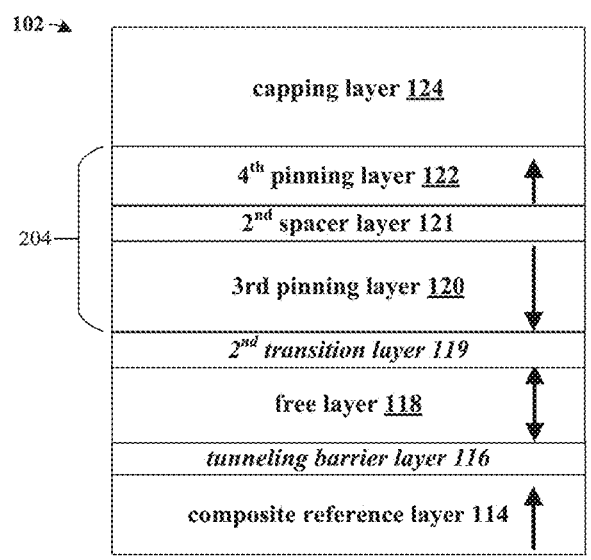
FIG. 5A illustrates a cross-sectional view of an MTJ stack balancing SyAF layer according to some alternative embodiments.
Figure 5B:
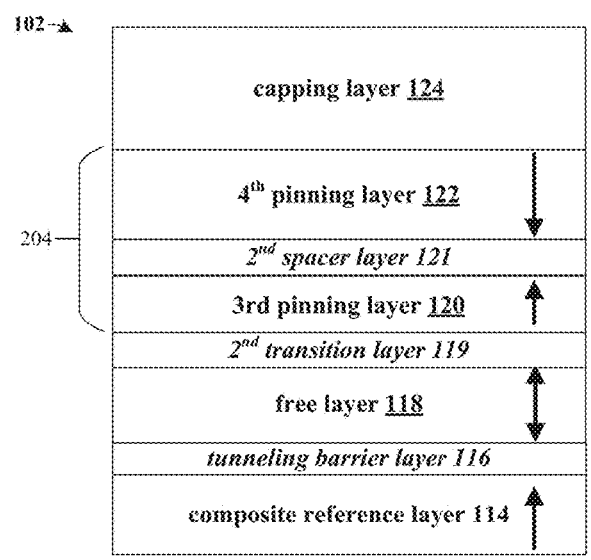
FIG. 5B illustrates a cross-sectional view of an MTJ stack balancing SyAF layer according to some alternative embodiments.

FIG. 5A and FIG. 5B respectively illustrate a cross-sectional view of an MTJ stack 102 including a balancing SyAF layer 204 according to some alternative embodiments. The MTJ stack 102 may be a more detailed structure of the MTJ stack 102 of FIG. 1, or can also stand alone. As shown in FIG. 5A or FIG. 5B, the free layer 118 is separated from the composite reference layer 114 by the tunnelling barrier layer 116. The balancing (second) SyAF layer 204 is disposed on one side of the free layer 118 opposite to the composite reference layer 114. The balancing SyAF layer 204 may comprise the third pinning layer 120, the fourth pinning layer 122 and the second spacer layer 121 similar to the features described above with reference to FIGS. 1-4B. A net stray field exerted on the free layer 118 by the composite reference layer 114 and the balancing SyAF layer 204 is zero or negligible. Thereby, the P-state and the AP-state of a memory device are balanced and both stabilized. The free layer 118 has magnetizations in opposite directions for the P-state and the AP-state. A net stray field exerted on the composite reference layer 114 is generated by the magnetizations of the free layer 118 and the balancing SyAF layer 204. The net stray field is zero or substantially zero at one state (e.g. AP-state) and in the same direction of the intrinsic magnetization direction of the composite reference layer 114 at the other state (e.g. P-state). Thereby, a back switching issue can be eliminated or at least reduced.

Figure 6:
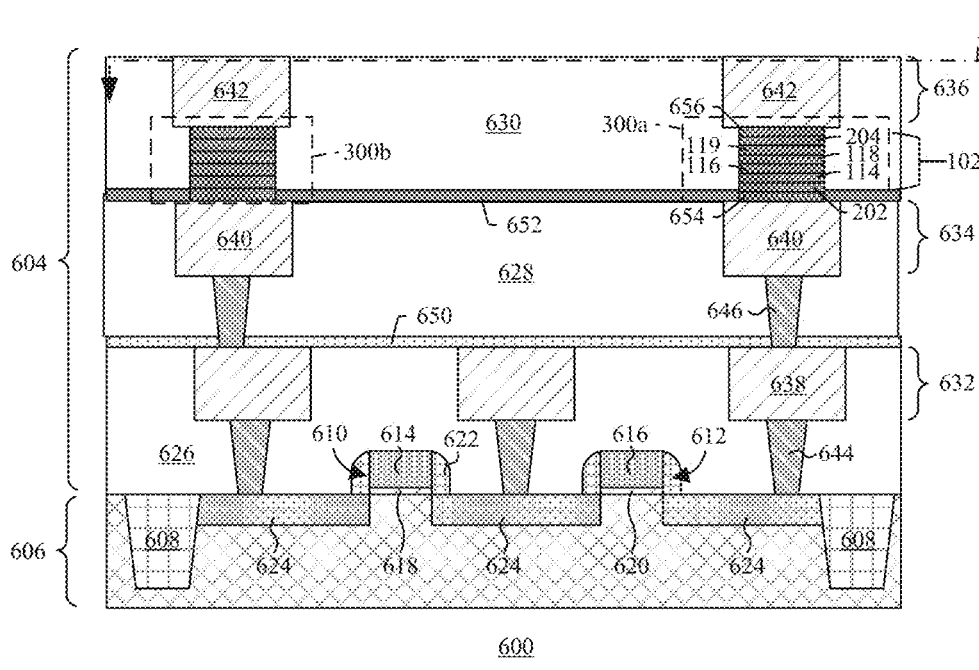
FIG. 6 illustrates a cross-sectional diagram illustrating some embodiments of a magneto resistive random access memory (MRAM) that include an MTJ stack with a balancing synthetic anti-ferromagnetic (SyAF) layer.

FIG. 6 illustrates a cross sectional view of some embodiments of an integrated circuit 600, which includes MRAM cells 300a, 300b disposed in an interconnect structure 604 of the integrated circuit 600. The integrated circuit 600 includes a substrate 606. The substrate 606 may be, for example, a bulk substrate (e.g., a bulk silicon substrate) or a silicon-on-insulator (SOI) substrate. The illustrated embodiment depicts one or more shallow trench isolation (STI) regions 608, which may include a dielectric-filled trench within the substrate 606.

Two word line transistors 610, 612 are disposed between the STI regions 608. The word line transistors 610, 612 include word line gate electrodes 614, 616, respectively; word line gate dielectrics 618, 620, respectively; word line sidewall spacers 622; and source/drain regions 624. The source/drain regions 624 are disposed within the substrate 606 between the word line gate electrodes 614, 616 and the STI regions 608, and are doped to have a first conductivity type which is opposite a second conductivity type of a channel region under the gate dielectrics 618, 620, respectively. The word line gate electrodes 614, 616 may be, for example, doped polysilicon or a metal, such as aluminum, titanium nitride, or silisides of cobalt, nickel, or tungsten. The word line gate dielectrics 618, 620 may be, for example, an oxide, such as silicon dioxide, or a high-κ dielectric material. The word line sidewall spacers 622 can be made of silicon nitride (e.g., $Si_3N_4$), for example.

The interconnect structure 604 is arranged over the substrate 606 and couples devices (e.g., transistors 610, 612) to one another. The interconnect structure 604 includes a plurality of IMD layers 626, 628, 630, and a plurality of metallization layers 632, 634, 636 which are layered over one another in alternating fashion. The IMD layers 626, 628, 630 may be made, for example, of a low κ dielectric, such as un-doped silicate glass, or an oxide, such as silicon dioxide, or an extreme low κ dielectric layer. The metallization layers 632, 634, 636 include metal lines 638, 640, 642, which are formed within trenches, and which may be made of a metal, such as copper or aluminum. Contacts 644 extend from the bottom metallization layer 632 to the source/drain regions 624 and/or gate electrodes 614, 616; and vias 646 extend between the metallization layers 632, 634, 636. The contacts 644 and the vias 646 extend through dielectric-protection layers 650, 652 (which can be made of dielectric material and can act as etch stop layers during manufacturing). The dielectric-protection layers 650, 652 may be made of an extreme low-κ dielectric material, such as SiC, for example. The contacts 644 and the vias 646 may be made of a metal, such as tungsten, cobalt, or copper, for example.

MRAM cells 300a, 300b, which are configured to store respective data states, are arranged within the interconnect structure 604 between neighboring metal layers. The MRAM cell 300a includes a bottom electrode 654 and a top electrode 656, which are made of conductive material. Between its top and bottom electrodes 656, 654, MRAM cell 300a includes an MTJ stack 102. The MTJ stack 102 may be the MTJ stack 102 described above with reference to FIG. 1, FIG. 2, FIG. 3, FIG. 4A, or FIG. 4B.

Figure 7:
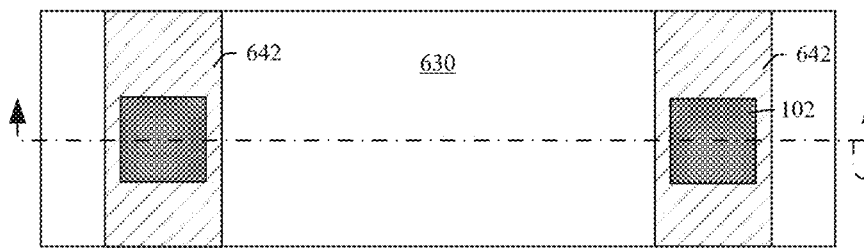
FIG. 7 illustrates a top view of the MRAM of FIG. 6, as indicated by the cut-lines in FIG. 6.

FIG. 7 depicts some embodiments of a top view of FIG. 6's integrated circuit 600 as indicated in the cut-away lines shown in FIGS. 6-7. The MRAM cells 300a, 300b can have a square or circular shape when viewed from above in some embodiments. In other embodiments, however, for example due to practicalities of many etch processes, the corners of the illustrated square shape can become rounded, resulting in MRAM cells 300a, 300b having a square shape with rounded corners, or having a circular shape. The MRAM cells 300a, 300b are arranged over metal lines 640, respectively, and have top electrodes 656 in direct electrical connection with the metal lines 642, respectively, without vias or contacts there between in some embodiments. In other embodiments, vias or contacts couple the top electrodes 656 to the metal lines 642.

Figure 8:
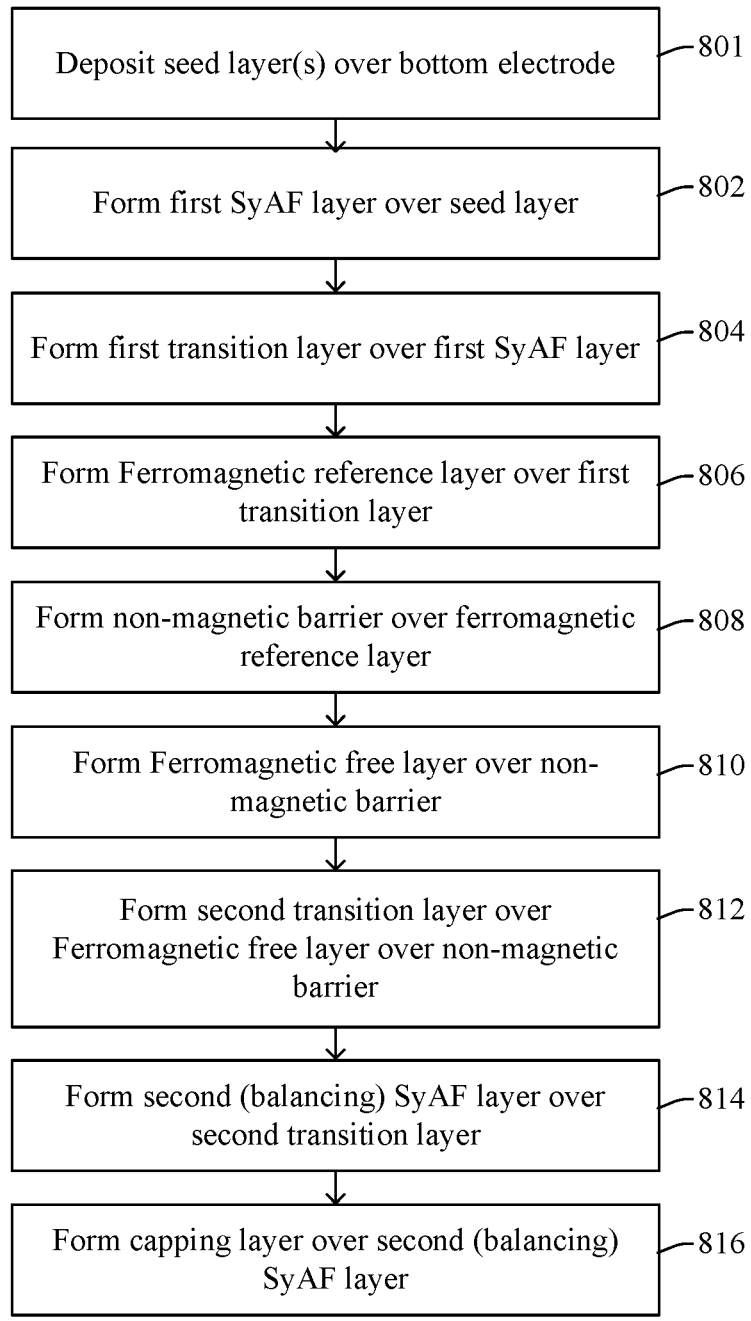
FIG. 8 illustrates a flowchart of some embodiments of the method of manufacturing an MTJ stack containing a balancing synthetic anti-ferromagnetic (SyAF) layer.

FIG. 8 illustrates a flowchart of some embodiments of the method of manufacturing a magnetic tunnel junction stack.

At act 801, a seed layer is formed on a wafer. In some embodiments, this act can, for example, correspond to forming a seed layer 108 as illustrated in FIG. 1. In some embodiments, the seed layer maybe a multilayer stack.

At act 802, a first SyAF layer is formed over seed layer. In some embodiments, this act can, for example, correspond to forming a first SyAF layer 202 over the seed layer 108 as illustrated in FIG. 1. In some embodiments, the first SyAF layer 202 maybe a multilayer stack comprising a first pining layer and a second pining layer separated by a spacer layer. For example, this act can correspond to forming a first pining layer 112 over a second pining layer 110 and separated from the second pining layer 110 by a first spacing layer 111 as illustrated in FIG. 2 or FIG. 3. In some alternative embodiments, the first SyAF layer 202 maybe a multilayer stack comprising a composite reference layer and a second pining layer separated by a spacer layer. For example, this act can correspond to forming a composite reference layer 114 over a second pining layer 110 and separated from the second pining layer 110 by a first spacing layer 111 as illustrated in FIG. 4A or FIG. 4B. The spacer layer (e.g. the first spacer layer 111) can be an anti-parallel coupling (APC) layer that causes an interexchange coupling (IEC) between the first pinning layer 112 (or the composite reference layer 114) and the second pinning layer 110 such that the first pining layer 112 and the second pinning layer 110 have anti-parallel magnetic directions. As examples, the spacer layer may comprise ruthenium (Ru) or Iridium (Ir).

At act 804, a first transition layer is formed over the first SyAF layer. In some embodiments, this act can, for example, correspond to forming a first transition layer 113 over the first SyAF layer 202 as illustrated in FIG. 1. The first transition layer 113 can be non-magnetic materials that are configured as a buffer layer, a lattice match layer, and/or a diffusion barrier. In some embodiments, the first transition layer 113 may respectively comprise tantalum (Ta), tungsten (W), molybdenum (Mo), Hafnium (Hf), or CoFeW.

At act 806, a ferromagnetic reference layer, which can even be a composite layer or a multi-layered set of ferromagnetic reference layer, spacer and another pinning layer, is formed over the first transition layer. In some embodiments, this act can, for example, correspond to forming a ferromagnetic reference layer 114 as illustrated in FIG. 1.

At act 808, a non-magnetic barrier is formed over the ferromagnetic reference layer. In some embodiments, this act can, for example, correspond to forming a tunneling barrier layer 116 as illustrated in FIG. 1.

At act 810, a free layer 118 is formed over the tunneling barrier layer. In some embodiments, this act can, for example, correspond to forming a free layer 118 over the lower non-magnetic tunneling barrier layer 116 as illustrated in FIG. 1.

At act 812, a second transition layer is formed over the free layer. In some embodiments, this act can, for example, correspond to forming a second transition layer 119 over the free layer 118 as illustrated in FIG. 1. The second transition layer 119 can be non-magnetic materials that are configured as a buffer layer, a lattice match layer, and/or a diffusion barrier. In some embodiments, the second transition layer 119 may comprise tantalum (Ta), tungsten (W), molybdenum (Mo), Hafnium (Hf), or CoFeW.

At act 814, a second (balancing) synthetic anti-ferromagnetic (SyAF) layer is formed over the second transition layer. In some embodiments, this act can, for example, correspond to forming a second SyAF layer 204 as illustrated in FIG. 1. In some embodiments, the second SyAF layer 204 maybe a multilayer stack comprising a third pining layer and a fourth pining layer separated by a second spacer layer. For example, this act can correspond to forming a third pining layer 120 over a fourth pining layer 122 and separated from the fourth pining layer 122 by a second spacing layer 121 as illustrated in FIGS. 2-5A. The second spacer layer 121 can be an anti-parallel coupling (APC) layer that causes an interexchange coupling (IEC) between the third pining layer 120 and the fourth pining layer 122 such that the third pining layer 120 and the fourth pining layer 122 have anti-parallel magnetic directions. As examples, the second spacer layer 121 may comprise ruthenium (Ru) or Iridium (Ir).

At act 816, a capping layer is formed over the second SyAF layer. In some embodiments, this act can, for example, correspond to forming a capping layer 124 over the second SyAF layer 204 as illustrated in FIG. 1.

While the flowchart 800 of FIG. 8 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 9:
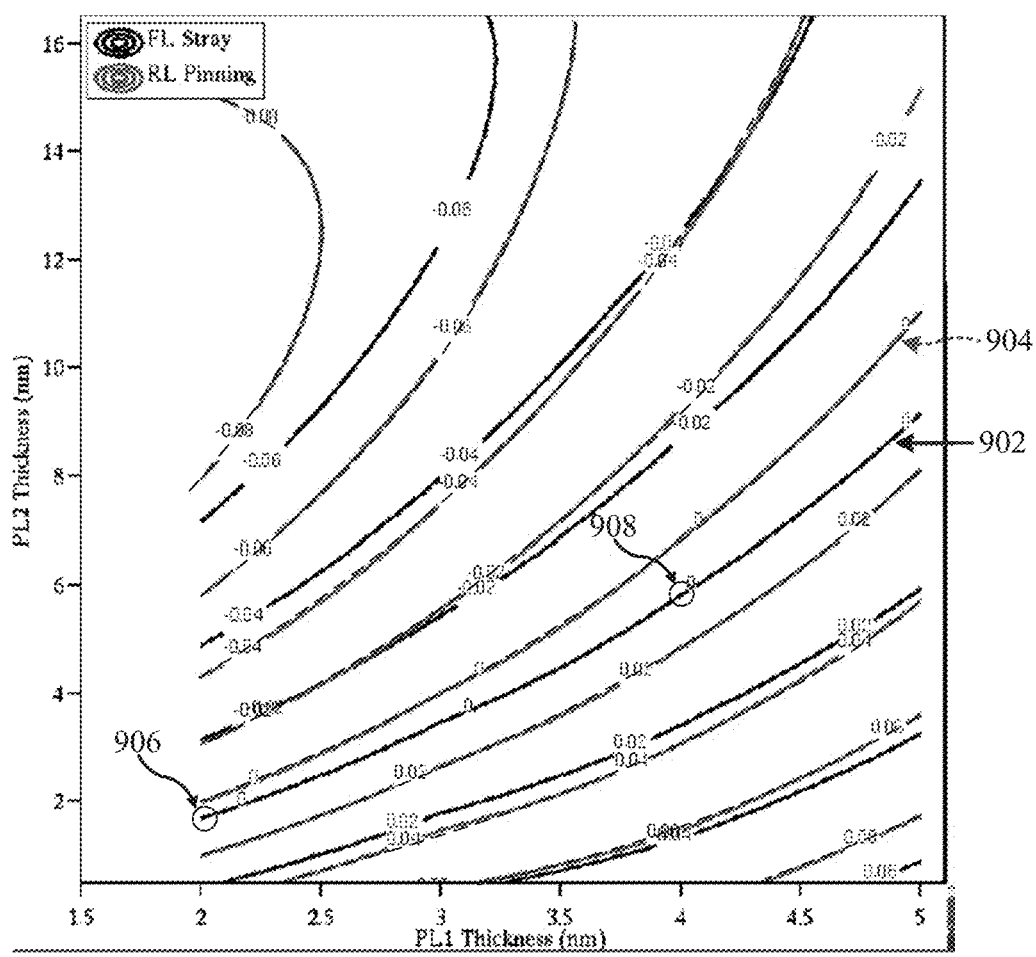
FIG. 9 illustrates a contour plot of an example thickness design of a balancing synthetic anti-ferromagnetic (SyAF) layer of a MTJ stack.

FIG. 9 illustrates a contour plot 900 of an example thickness design of a balancing synthetic anti-ferromagnetic (SyAF) layer of an MTJ stack. The MTJ stack can be the MTJ stack 102 shown and discussed above in FIGS. 1-8. As an example, a thickness of a third pinning layer (e.g. the third pinning layer 120 in FIG. 1) is set as 4 nm; and a thickness of a fourth pinning layer (e.g. the fourth pinning layer 122 in FIG. 1) is set as 1 nm. A thickness of a first pinning layer (e.g. the first pinning layer 112 in FIG. 1) is plotted as the horizontal axis; and a thickness of a second pinning layer (e.g. the second pinning layer 110 in FIG. 1) is plotted as the vertical axis. The solid lines are plotted as the net stray field inserted on the free layer (e.g. the free layer 118 in FIG. 1) by the other magnetic layers. The dashed lines are plotted as the net stray field inserted on the reference layer (e.g. the reference layer 114 in FIG. 1) by the magnetizations of the first SyAF layer 202, and the second SyAF layer 204. As discussed above with reference to FIG. 1, the net stray field exerted on the free layer 118 can be chosen to be negligible or zero, as shown by the solid line 902. Thereby, the P-state and the AP-state of magnetic memory device 100 are balanced and both stabilized. The net stray field exerted on the reference layer 114 is positive, or in another word, in the same direction of the intrinsic magnetization direction of the reference layer 114. Thereby, a backswitching issue can be eliminated or at least reduced. As shown in FIG. 9, the dashed line 904 shows a zero net stray field on the reference layer, and the net stray field exerted on the reference layer 114 is positive at positions of the solid line 902. Thus, there are valid solutions for the thickness design of the pinning layers. As an example, a first solution is circled by circle 906, where the first pinning layer has a thickness of around 2 nm, and the second pinning layer has a thickness of around 1.7 nm. As another example, a second solution is circled by circle 908, where the first pinning layer has a thickness of around 4 nm, and the second pinning layer has a thickness of around 5.8 nm.

Note that although this disclosure is described largely in the context of memory, the disclosure can also be applied to spin-logic, spin based random number generators, and spin based neuromorphic computing as a computing element. In all these applications we rely on raw performance of the MTJ, and improvements of any such MTJ as described in this disclosure are also applicable to these technologies.

Thus, in some embodiments, the present application provides a magnetic memory device. The magnetic memory device comprises a bottom electrode, and a first synthetic anti-ferromagnetic (SyAF) layer including a first pinning layer and a second pinning layer disposed over the bottom electrode and having opposite magnetization directions and separated by a first spacer layer. The magnetic memory device further comprises a reference layer disposed over the first pair of pinning layers and a free layer disposed over the reference layer and separated from the reference layer by a tunneling barrier layer. The magnetic memory device further comprises a second synthetic anti-ferromagnetic (SyAF) layer including a third pinning layer and a fourth pinning layer disposed over the free layer and having opposite magnetization directions and separated by a second spacer layer.

In other embodiments, the present application provides a magnetic memory device. The memory device comprises a free layer and a reference layer disposed on a first side of the free layer and separated from the free layer by a tunneling barrier layer. The memory device further comprises a balancing synthetic anti-ferromagnetic (SyAF) layer disposed on a second side of the free layer opposite to the first side, the balancing synthetic anti-ferromagnetic (SyAF) layer including a pair of pinning layers having opposite magnetization directions and separated by a spacer layer.

In yet other embodiments, the present disclosure provides an integrated circuit including a semiconductor substrate. An interconnect structure is disposed over the semiconductor substrate, and includes a plurality of dielectric layers and a plurality of metal layers stacked over one another. The plurality of metal layers includes a lower metal layer and an upper metal layer disposed over the lower metal layer. A magneto-resistive random access memory (MRAM) cell is arranged over the upper metal layer. The MRAM cell includes a bottom electrode disposed over and in electrical contact with the lower metal layer. A magnetic tunnel junction (MTJ) is disposed over an upper surface of the bottom electrode. The MTJ cell comprises a bottom electrode disposed over and in electrical contact with the lower metal layer, and a top electrode disposed under and in electrical contact with the upper metal layer. The MTJ cell further comprises a free layer and a reference layer disposed between the bottom electrode and the top electrode, stacked, and separated by a tunneling barrier layer and a first pinning layer on one side of the reference layer opposite to the free layer. The MTJ cell further comprises a balancing synthetic anti-ferromagnetic (SyAF) layer disposed on a second side of the free layer opposite to the reference layer, the balancing synthetic anti-ferromagnetic (SyAF) layer including a pair of pinning layers having opposite magnetization directions and separated by a spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic memory device, comprising:
   a bottom electrode;
   a first synthetic anti-ferromagnetic (SyAF) layer including a first pinning layer and a second pinning layer disposed over the bottom electrode and having opposite magnetization directions and separated by a first spacer layer, with the second pinning layer being the one closer to the bottom electrode;
   a reference layer disposed over the first SyAF layer;
   a free layer disposed over the reference layer and separated from the reference layer by a tunneling barrier layer; and
   a second synthetic anti-ferromagnetic (SyAF) layer including a third pinning layer and a fourth pinning layer disposed over the free layer and having opposite magnetization directions and separated by a second spacer layer, with the third pinning layer being the one closer to the free layer.

2. The magnetic memory device of claim 1, wherein the third pinning layer has a magnetization direction aligned and anti-parallel with a magnetization direction of the reference layer.

3. The magnetic memory device of claim 2, wherein the fourth pinning layer has a magnetization direction aligned and parallel with the magnetization direction of the reference layer.

4. The magnetic memory device of claim 1, further comprising:
   a first transition layer disposed between the reference layer and the first pinning layer; and
   a second transition layer disposed between the free layer and the third pinning layer;
   wherein the first transition layer and the second transition layer respectively comprises non-magnetic metals.

5. The magnetic memory device of claim 4, wherein the first transition layer and the second transition layer respectively comprises tantalum (Ta), tungsten (W), molybdenum (Mo), Hafnium (Hf), or CoFeW.

6. The magnetic memory device of claim 1, wherein the first spacer layer and the second spacer layer respectively comprises ruthenium (Ru) or iridium (Ir).

7. The magnetic memory device of claim 1, wherein the first synthetic anti-ferromagnetic (SyAF) layer, the second synthetic anti-ferromagnetic (SyAF) layer, and the reference layer are configured to colletively generate a zero net stray field on the free layer.

8. The magnetic memory device of claim 1, wherein the first synthetic anti-ferromagnetic (SyAF) layer and the second synthetic anti-ferromagnetic (SyAF) layer are configured to generate a net stray field that points in a magnetization direction of the reference layer.

9. A magnetic memory device, comprising:
   a free layer;
   a reference layer disposed on a first side of the free layer and separated from the free layer by a tunneling barrier layer; and
   a balancing synthetic anti-ferromagnetic (SyAF) layer disposed on a second side of the free layer opposite to the first side, the balancing synthetic anti-ferromagnetic (SyAF) layer including a pair of pinning layers having opposite magnetization directions and separated by a spacer layer.

10. The magnetic memory device of claim 9, wherein the magnetization directions of the pair of pinning layers are aligned with a magnetization direction of the reference layer.

11. The magnetic memory device of claim 9, further comprising:
    a first spacer layer disposed on one side of the reference layer opposite to the free layer; and
    a first pinning layer disposed on one side of the first spacer layer opposite to the reference layer.

12. The magnetic memory device of claim 11, wherein the first pinning layer, the balancing synthetic anti-ferromagnetic (SyAF) layer, and the reference layer are configured to collectively generate a zero net stray field on the free layer.

13. The magnetic memory device of claim 11, wherein the first pinning layer, the balancing synthetic anti-ferromagnetic (SyAF) layer, and the free layer are configured to collectively generate a positive net stray field on the reference layer.

14. The magnetic memory device of claim 11, wherein the first pinning layer has a magnetization direction aligned and anti-parallel with a magnetization direction of the reference layer.

15. The magnetic memory device of claim 11, wherein the spacer layer and the first spacer layer respectively comprises ruthenium (Ru) or iridium (Ir).

16. The magnetic memory device of claim 9, further comprising a first synthetic anti-ferromagnetic (SyAF) layer disposed on the first side of the free layer and separated from the free layer by the reference layer;

wherein the first synthetic anti-ferromagnetic (SyAF) layer includes a first pinning layer and a second pinning layer having opposite magnetization directions and separated by a first spacer layer.

17. The magnetic memory device of claim 16, further comprising a first transition layer disposed between the reference layer and the first pinning layer.

18. The magnetic memory device of claim 17, further comprising:

a second transition layer disposed between the free layer and the balancing synthetic anti-ferromagnetic (SyAF) layer;

wherein the first transition layer and the second transition layer respectively comprises non-magnetic metals.

19. The magnetic memory device of claim 18, wherein the first transition layer and the second transition layer respectively comprises tantalum (Ta), tungsten (W), molybdenum (Mo), afnium (Hf), niobium (Nb), or CoFeW.

20. An integrated circuit, comprising:

a semiconductor substrate;

an interconnect structure disposed over the semiconductor substrate, and including a plurality of dielectric layers and a plurality of metal layers stacked over one another, wherein the plurality of metal layers include a lower metal layer and an upper metal layer disposed over the lower metal layer;

a magnetoresistive random access memory (MRAM) cell arranged over the upper metal layer, the MRAM cell comprising:

a bottom electrode disposed over and in electrical contact with the lower metal layer;

a top electrode disposed under and in electrical contact with the upper metal layer;

a free layer and a reference layer disposed between the bottom electrode and the top electrode, stacked, and separated by a tunneling barrier layer;

a first pinning layer on one side of the reference layer opposite to the free layer; and a balancing synthetic anti-ferromagnetic (SyAF) layer disposed on a second side of the free layer opposite to the reference layer, the balancing synthetic anti-ferromagnetic (SyAF) layer including a pair of pinning layers having opposite magnetization directions and separated by a spacer layer.

* * * * *